United States Patent [19]

Campi

[11] 4,021,759

[45] May 3, 1977

[54] EMP LINE FILTER USING MOV DEVICES

[75] Inventor: Morris Campi, Silver Spring, Md.

[73] Assignee: The United States of America as represented by the Secretary of the Army, Washington, D.C.

[22] Filed: Jan. 19, 1976

[21] Appl. No.: 650,349

[52] U.S. Cl. .................... 333/70 R; 333/17 L; 333/79; 361/119

[51] Int. Cl.² .................. H03H 13/00; H03H 7/10; H03H 7/14; H02H 3/22

[58] Field of Search ............. 333/79, 70 R, 70 CR, 333/17 L; 317/50, 61, 61.5, 70, 256, 53; 338/21

[56] References Cited

UNITED STATES PATENTS

| | | | |
|---|---|---|---|
| 3,572,247 | 3/1971 | Warshall | 333/79 X |
| 3,824,431 | 7/1974 | Schlicke | 317/61 |
| 3,842,374 | 10/1974 | Schlicke | 333/79 |
| 3,845,358 | 10/1974 | Anderson et al. | 317/61 |
| 3,863,111 | 1/1975 | Martzloff | 317/61.5 |

Primary Examiner—Paul L. Gensler
Assistant Examiner—Marvin Nussbaum
Attorney, Agent, or Firm—Nathan Edelberg; Robert P. Gibson; Saul Elbaum

[57] ABSTRACT

Two cylindrical sleeves of metal oxide varistor material (MOV) are used as capacitive elements of a low pass feedthrough pi-filter network. A metallic housing coaxially surrounds the MOV sleeves and provides electrical contact to ground. The inner surface of each sleeve is electrically connected to an inductor whose leads are terminated by feedthrough connectors on either side of the metal housing. The sleeve inner diameter is large enough to envelop the inductance thereby reducing the package length. The combined shunt capacitance and series inductance form the low pass pi-filter network. At normal signal levels, the package acts as a normal feedthrough low pass pi-filter network. At higher signal levels and transients, the bipolar MOV components clamp the voltage to a given level, determined by the MOV material grain structure and sleeve thickness.

10 Claims, 2 Drawing Figures

EMP LINE FILTER USING MOV DEVICES

RIGHTS OF THE GOVERNMENT

The invention described herein may be manufactured, used, and licensed by or for the United States Government for governmental purposes without the payment to me of any royalty thereon.

FIELD OF THE INVENTION

The present invention relates to electrical surge protection, and more particularly to a filter, utilizing MOV devices for protecting against electromagnetic pulses, at the input of a communication terminal.

BRIEF DESCRIPTION OF THE PRIOR ART

Many telephone and teletype communication terminals include protective devices at the input thereof. A prevalent form of overvoltage or surge protection at such terminals includes an arc or lightning arrestor. Such an arrestor is usually followed by an electromagnetic interference (EMI) filter. The arrestor serves to suppress the effects of overvoltage, while the filter acts as a low pass filter to eliminate transient signals that would be inherent with EMI.

Although this approach is generally satisfactory, there is a limitation on the frequency and surge levels for which this prior art approach works. Thus, by way of example, in the environment of a nuclear blast, the electromagnetic pulse (EMP) signals are of sufficiently higher intensity and frequency content than the interference signals for which the prior art protective devices have been designed. Thus, in the environment of a nuclear blast, the arc or lightning arrestors would not be capable of suppressing high frequency and high level EMP. As a result, the conventional EMI filter would be destroyed thereby open circuiting a communication link to a connected terminal.

MOV devices have been used as voltage clamping devices. However, the inherent capacitance of these devices limits their utilization to relatively low frequencies, that is up to approximately 1 MHz. Thus, the utilization of these devices has not been recognized for high frequency overvoltage signals with which the present invention is concerned.

BRIEF DESCRIPTION OF THE PRESENT INVENTION

The present invention utilizes the inherent capacitance of an MOV device, with its voltage clamping capability, as a means for creating a capacitive filter element, which may be combined with other filter elements, such as inductors, for creating an extremely effective low pass filter for surge protection. As a means for illustrating the concept, a pi-filter has been chosen as an illustrative embodiment. By developing a filter configuration using MOV devices, a surge protector is developed which has a faster high frequency roll off than would be possible by using an MOV device as a two-terminal component connected across the input of a communication terminal for voltage clamping performance. The same fast frequency roll off as well as the filter configuration capability of clamping high voltage transients makes the present invention far superior to the prior art scheme of connecting an arc or lightning arrestor in series with an EMI filter.

The present invention includes the filter components mounted in a package that may be connected, in-line as a low pass feedthrough filter.

BRIEF DESCRIPTION OF THE FIGURES

The above-mentioned objects and advantages of the present invention will be more clearly understood when considered in conjunction with the accompanying drawings, in which.

DETAILED DESCRIPTION OF THE INVENTION

Figure 1:
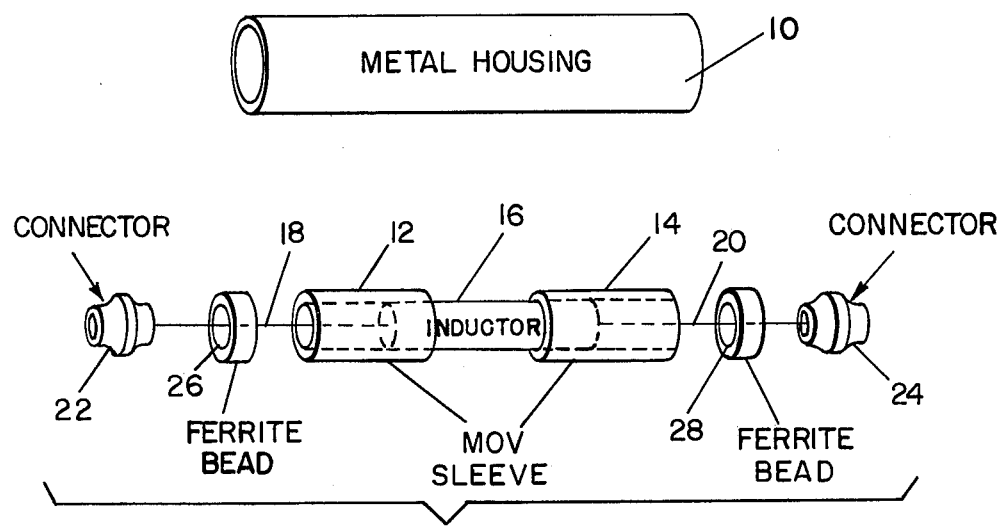
FIG. 1 is a mechanical disassembled view of a filter, in accordance with the invention.

The embodiment illustrated in FIG. 1 is in the form of a line filter of the feedthrough type. A metal housing 10 resembles an elongated sleeve and coaxially surrounds components disposed in the interior thereof. Two spaced sleeves, of a smaller outer diameter than the inner diameter of metal housing 10 are coaxially disposed with respect to one another and the housing 10. The sleeves 12 and 14 are fabricated from MOV (metal oxide varistor) material. The MOV sleeves 12 and 14 in turn receive a discrete inductor 16, which is in coaxial inward relationship to the MOV sleeves 12, 14 and the metal housing 10. The inductor 16 includes connecting leads 18 and 20 that extend to the right and left, as shown in FIG. 1. The lead 18 terminates in a connector 22 while the lead 20, at an opposite end of the inductor, terminates in the connector 24.

The metallic housing 10 is in physical contact with the MOV sleeves 12 and 14 so that the MOV sleeves may be electrically connected to ground, through the metal housing 10. The connectors 22 and 24 are received within respective bores of MOV sleeves 12 and 14, so that electrical connections are completed between the inductor 16 and the MOV sleeves. As a result, a low pass feedthrough pi-filter results.

Figure 2:
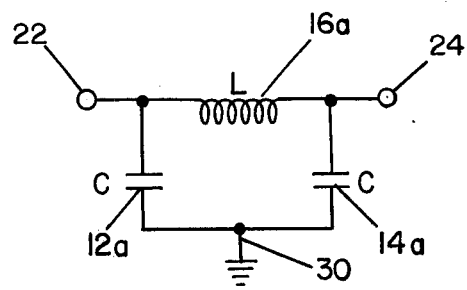
FIG. 2 is an electrical equivalent circuit for the filter of FIG. 1.

An electrical equivalent circuit for the structure of FIG. 1 is shown in FIG. 2. The capacitive and inductor components relate in numbering to the actual structure shown in FIG. 1, followed by the suffix a. The input and output of the two port filter network are indicated by reference numerals 22 and 24, to correspond with the actual connectors 22 and 24 shown in FIG. 1. Each MOV sleeve serves as a capacitance, through ground 30 for the filter.

The addition of ferrite beads 26 and 28, on the leads 18 and 20 may be used to enhance rf suppression.

At normal signal levels, the package acts as a normal feedthrough low pass pi-filter network. At higher signal levels and transients, the bipolar MOV components clamp the voltage to a given level, determined by the MOV material grain structure and sleeve thickness.

Although the illustrated embodiment discloses a low pass feedthrough pi-filter, it is to be emphasized that this is merely exemplary. The basic concept of the present invention is to adapt MOV devices, to a feedthrough filter, by utilizing the inherent capacitance of MOV. By so utilizing the MOV devices, faster high frequency roll off and clamping for relatively high voltage levels may be realized for surge protection of communication lines, particularly at the input of communication terminals.

It should be understood that the invention is not limited to the exact details of construction shown and described herein for obvious modifications will occur to persons skilled in the art.

I claim the following:

1. In a line filter for protecting electrical circuits from transient high frequency voltage surges, a configuration comprising:
   an elongated conductive housing with an axial bore;
   at least one centrally hollowed MOV device fabricated in the form of a sleeve located within the housing and within electrical contact therewith;
   at least one discrete inductor located within the MOV device, the inductor received axially with the sleeve; and
   a plurality of connecting means located at opposite ends of the housing, the connecting means fabricated so as to internally abut the MOV device, and electrically connected with the MOV device and the inductor for completing a filter configuration, the connector means also furnishing connection points to an electrical circuit to be protected.

2. The subject matter set forth in claim 1 wherein the filter employs two MOV devices fabricated in the form of sleeves, and further wherein the inductor is received axially within both sleeves.

3. The subject matter set forth in claim 2 wherein the inductor has oppositely extending leads for connection to the connector means.

4. The subject matter set forth in claim 3 wherein the connector means comprises first and second connectors for connection to respective inductor leads, the connectors being in physical contact with the MOV sleeves for completing an electrical connection therewith.

5. The subject matter set forth in claim 3 wherein the connector means comprises first and second connectors for series connection with a communication line, to subject signals on the line to low pass feedthrough pi-filtering.

6. The subject matter set forth in claim 4 together with means positioned on the inductor leads for enhancing rf suppression by the filter.

7. The subject matter set forth in claim 5 wherein the first and second connectors are respectively connected to the inductor leads.

8. The subject matter set forth in claim 6 wherein the rf suppression means are individual ferrite beads.

9. The subject matter set forth in claim 7 wherein the first and second connectors are positioned in physical contact with the MOV sleeves for completing electrical contact therewith.

10. The subject matter set forth in claim 9 wherein the housing is a cylinder having an axial bore formed therethrough.

* * * * *